US012308802B2

United States Patent
Rexberg et al.

(10) Patent No.: US 12,308,802 B2
(45) Date of Patent: May 20, 2025

(54) RECURSIVE LINEARIZATION OF A NON-LINEAR MODEL FOR AN ELECTRONIC DEVICE

(71) Applicant: Telefonaktiebolaget LM Ericsson (publ), Stockholm (SE)

(72) Inventors: Leonard Rexberg, Hässelby (SE); Ashim Biswas, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 570 days.

(21) Appl. No.: 17/772,690

(22) PCT Filed: Oct. 29, 2019

(86) PCT No.: PCT/SE2019/051072
§ 371 (c)(1),
(2) Date: Apr. 28, 2022

(87) PCT Pub. No.: WO2021/086238
PCT Pub. Date: May 6, 2021

(65) Prior Publication Data
US 2023/0006614 A1    Jan. 5, 2023

(51) Int. Cl.
*H03G 3/30* (2006.01)
*H03F 1/32* (2006.01)
(Continued)

(52) U.S. Cl.
CPC ............. *H03F 1/3258* (2013.01); *H03F 3/21* (2013.01); *H03H 17/02* (2013.01);
(Continued)

(58) Field of Classification Search
CPC ....................................... H03G 3/30
(Continued)

(56) References Cited

U.S. PATENT DOCUMENTS 6,801,086 B1   10/2004   Chandrasekaran
9,484,962 B1   11/2016   Magesacher et al.
(Continued)

FOREIGN PATENT DOCUMENTS

EP    1746720 A1    1/2007

OTHER PUBLICATIONS

International Search Report and the Written Opinion of the International Searching Authority, issued in corresponding International Application No. PCT/SE2019/051072, dated Jun. 23, 2020, 13 pages.
(Continued)

*Primary Examiner* — Henry Choe
(74) *Attorney, Agent, or Firm* — Rothwell, Figg, Ernst & Manbeck, P.C.

(57) ABSTRACT

There is provided mechanisms for enabling linearization of a non-linear electronic device. A method is performed by a linearizer device. The method comprises receiving an input signal destined to be input to the non-linear electronic device. Input-output characteristics of the non-linear electronic device is represented by a model. The model is defined by a mathematical expression, and wherein input-output characteristics of the linearizer device is given by the linearization function. The linearization function is determined by applying a function recursion to the mathematical expression of the model. The method comprises obtaining an output signal by subjecting the input signal to the linearization function. The method comprises providing the output signal, instead of the input signal, as input to the non-linear electronic device, thereby enabling linearization of the non-linear electronic device.

15 Claims, 5 Drawing Sheets

(51) Int. Cl.
*H03F 3/21* (2006.01)
*H03H 17/02* (2006.01)
*H03H 17/00* (2006.01)

(52) U.S. Cl.
CPC .. *H03F 2200/294* (2013.01); *H03F 2200/451* (2013.01); *H03H 2017/0081* (2013.01)

(58) Field of Classification Search
USPC .................................................. 330/279, 278
See application file for complete search history.

(56) References Cited

U.S. PATENT DOCUMENTS

| | | |
|---|---|---|
| 2004/0130394 A1 | 7/2004 | Mattsson et al. |
| 2004/0247042 A1 | 12/2004 | Sahlman |
| 2013/0114762 A1 | 5/2013 | Azadet et al. |

OTHER PUBLICATIONS

Magesacher et al. "Benchmarking of Learning Architectures for Digital Predistortion" Conference Proceedings of 2016 50th Asilomar Conference on Signals, Systems and Computers, Nov. 6-9, 2016, Pacific Grove, CA, USA, ISBN 978-1-5386-3954-2, pp. 648-651.

Andersson et al. "Linearization of Power Amplifier using Digital Predistortion, Implementation on FPGA" Dissertation. Linköping University, Faculty of Science and Engineering (Institute of Technology) (LITH), 2014, 91 pages, retrieved from: http://urn.kb.se/resolve?urn=urn:nbn:se:liu:diva-112258.

Jung "Estimation of Inverse Models Applied to Power Amplifier Predistortion" Licentiate Thesis, Linköping University, Division of Automatic Control, Department of Electrical Engineering, 2013, ISSN 0280-7971, 152 pages, retrieved from: http://www.diva-portal.org/smash/get/diva2:647126/FULLTEXT02.pdf.

Saleh et al. "Adaptive Linearization of Power Amplifiers in Digital Radio Systems" The Bell System Technical Journal, vol. 62, No. 4, 1983, pp. 1019-1033, retrieved from: https://ieeexplore.ieee.org/document/6768243.

Morgan et al. "A Generalized Memory Polynomial Model for Digital Predistortion of RF Power Amplifiers" IEEE Transactions on Signal Processing, vol. 54, No. 10, Oct. 2006, pp. 3852-3860.

Ding et al. "A Robust Digital Baseband Predistorter Constructed Using Memory Polynomials" IEEE Transactions on Communications, vol. 52, No. 1, Jan. 2004, pp. 159-165.

Cavers "Amplifier Linearization Using a Digital Predistorter with Fast Adaptation and Low Memory Requirements" IEEE Transactions on Vehicular Technology, vol. 39. No. 4, Nov. 1990, pp. 374-382.

Saleh "Frequency-Independent and Frequency-Dependent Nonlinear Models of TWT Amplifiers" IEEE Transactions on Communications, vol. COM-29, No. 11, Nov. 1981, pp. 1715-1720.

Ding et al. "Memory Polynomial Predistorter Based on the Indirect Learning Architecture" IEEE, 2002, pp. 967-971.

Fig. 10

RECURSIVE LINEARIZATION OF A NON-LINEAR MODEL FOR AN ELECTRONIC DEVICE

CROSS REFERENCE TO RELATED APPLICATION(S)

This application is a 35 U.S.C. § 371 National Phase Entry Application from PCT/SE2019/051072, filed Oct. 29, 2019, designating the United States, the disclosure of which is incorporated herein by reference in its entirety.

TECHNICAL FIELD

Embodiments presented herein relate to a method, a linearizer device, a computer program, and a computer program product for enabling linearization of a non-linear electronic device.

BACKGROUND

Some electronic devices exhibit non-linear input-output characteristics and are therefore referred to as non-linear electronic devices. Non-linear electronic devices can be found in many types of electronic equipment, such as transmitters, receivers, transceivers, signal converters, and the like. Non-limiting examples of non-linear electronic devices are radio frequency (RF) amplifiers, power amplifiers (PAs), low-noise amplifiers (LNAs), digital-to-analog converters (DACs), and analog-to-digital converters (ADCs).

In some scenarios the non-linear behaviour caused by the non-linear input-output characteristics is undesired and efforts are therefore made to make the non-linear input-output characteristics linear, and thus to linearize the non-linear electronic device. One way to linearize the non-linear electronic device is to connect the output of a linearizer device to the input of the non-linear electronic device such that the input to the non-linear electronic device is fed, and processed by, the linearizer device.

Traditionally, the input-output characteristics of the linearizer device could be selected according to a look-up table (LUT) based either on a model of the non-linear electronic device or based on measurements.

Even if the non-linear electronic device might obey a fairly simple model, the linearizer device might have to have a more complex implementation of its linearization function and even need addition of extra terms in a general expansion as to give the necessary linearization.

As a first illustrative example, the simplest non-linear model on one hand, only incorporating the third order intermodulation product, would require the linearizer device to have far more terms in the expansion of the linearization function than in the model of the non-linear device on the other hand.

As a second illustrative example, assume that the model of the non-linear electronic device is defined by a transfer function being a digital version description of two taps in a finite impulse response (FIR). Then the linearizer function cannot have just a two-tap representation; it would need substantially more taps to provide the desired linearization.

Hence, there is still a need for improved linearization of non-linear electronic devices.

SUMMARY

An object of embodiments herein is to provide efficient linearization of non-linear electronic devices.

In more detail, an object is to provide efficient linearization of non-linear electronic devices in terms of how many free parameters are required to tune the input-output characteristics of the linearizer device the memory depth needed to implement the linearization function.

According to a first aspect there is presented a method for enabling linearization of a non-linear electronic device. The method is performed by a linearizer device. The method comprises receiving an input signal destined to be input to the non-linear electronic device. Input-output characteristics of the non-linear electronic device is represented by a model. The model is defined by a mathematical expression, and wherein input-output characteristics of the linearizer device is given by the linearization function. The linearization function is determined by applying a function recursion to the mathematical expression of the model. The method comprises obtaining an output signal by subjecting the input signal to the linearization function. The method comprises providing the output signal, instead of the input signal, as input to the non-linear electronic device, thereby enabling linearization of the non-linear electronic device.

According to a second aspect there is presented a linearizer device for enabling linearization of a non-linear electronic device. The linearizer device comprises processing circuitry. The processing circuitry is configured to cause the linearizer device to receive an input signal destined to be input to the non-linear electronic device. Input-output characteristics of the non-linear electronic device is represented by a model. The model is defined by a mathematical expression, and wherein input-output characteristics of the linearizer device is given by the linearization function. The linearization function is determined by applying a function recursion to the mathematical expression of the model. The processing circuitry is configured to cause the linearizer device to obtain an output signal by subjecting the input signal to the linearization function. The processing circuitry is configured to cause the linearizer device to provide the output signal, instead of the input signal, as input to the non-linear electronic device, thereby enabling linearization of the non-linear electronic device.

According to a third aspect there is presented a linearizer device for enabling linearization of a non-linear electronic device. The linearizer device comprises a receive module configured to receive an input signal destined to be input to the non-linear electronic device. Input-output characteristics of the non-linear electronic device is represented by a model. The model is defined by a mathematical expression, and wherein input-output characteristics of the linearizer device is given by the linearization function. The linearization function is determined by applying a function recursion to the mathematical expression of the model. The linearizer device comprises an obtain module configured to obtain an output signal by subjecting the input signal to the linearization function. The linearizer device comprises a provide module configured to provide the output signal, instead of the input signal, as input to the non-linear electronic device, thereby enabling linearization of the non-linear electronic device.

According to a fourth aspect there is presented a computer program for enabling linearization of a non-linear electronic device, the computer program comprising computer program code which, when run on a linearizer device, causes the linearizer device to perform a method according to the first aspect.

According to a fifth aspect there is presented a computer program product comprising a computer program according to the fourth aspect and a computer readable storage medium on which the computer program is stored. The computer readable storage medium could be a non-transitory computer readable storage medium.

Advantageously, this provides efficient linearization of the non-linear electronic device.

Advantageously, this provides efficient linearization of the non-linear electronic device requiring only few free parameters to tune the input-output characteristics of the linearizer device and low the memory depth to implement the linearization function.

Advantageously, the herein disclosed mechanisms, whilst requiring only few free parameters, enable a wide range of polynomial degrees to be realized and used.

Moreover, for a polynomial approach, the instantiation is made via Function Recursion where a function calls itself a finite number of times. This finite number determines in the end the polynomial degree of the linearizer device.

Advantageously, the herein disclosed mechanisms enable deduction of unknown or hidden terms may, rather than postulating, for example, a power series as the linearizer function where the coefficients are solved by some minimization process of a pre-defined cost function. As an example, cross-terms between present and delayed samples in a pre-distorter having the structure of a General Memory Polynomial (GMP) may be intrinsically extracted and do not necessarily have to be identified beforehand. The herein disclosed mechanisms could therefore be used as a pruning technique, automatically picking all the combinations of cross term products and adding them automatically.

Advantageously, instead of introducing non-linear infinite impulse response (IIR) structures to equalize memory effects, the herein disclosed mechanisms enable control of stopping the feedback at an amount that is controlled by the recursion depth. This gives a stability to the memory compensation that is not inherently guaranteed by a classical IIR structure.

Advantageously, the herein disclosed mechanisms are suitable for implementation in soft digital frontends (DFE).

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
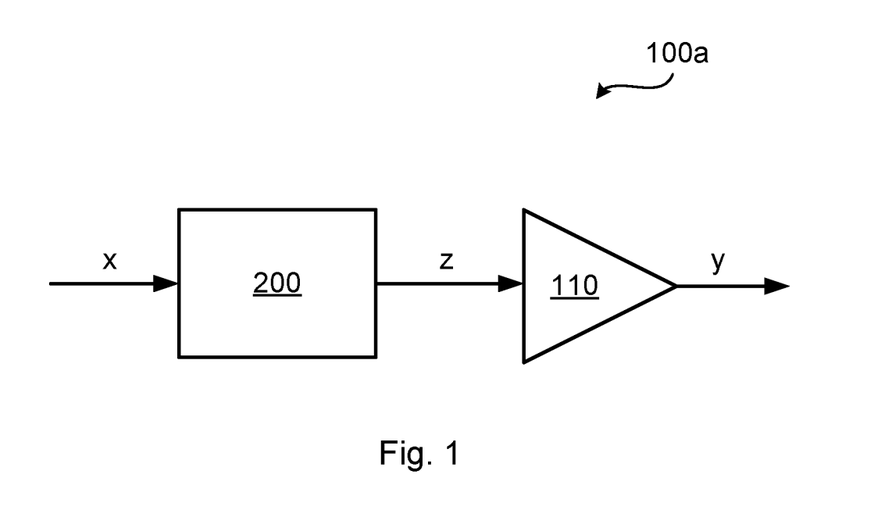
FIGS. 1 and 7 are schematic illustrations of a linearizer device and a non-linear electronic device according to embodiments.

FIG. 1 is a schematic diagram illustrating a system bow comprising a non-linear electronic device 110 and a linearizer device 200 according to an embodiment. The non-linear electronic device 110 is to receive an input signal (z) and, after processing, provide an output signal (y). However, a linearizer device 200 is placed in front of the non-linear electronic devices 110 such that the input signal (z) instead is received by the linearizer device 200 which, after processing, provides an output signal (z). This output signal (z) is thus instead of the input signal (x) provided as input to the non-linear electronic devices 110. As will be further disclosed below, the linearizer device 200 is configured to process the signal (x) such that the relation between the signal (y) and the signal (x) appears to be linear.

In short, input-output characteristics of the non-linear electronic device 110 is represented by a model, where the model is defined by a mathematical expression. The linearizer device 200 has input-output characteristics given by a linearization function (also known as an inversion function), defined by the inverse of the model, where the inverse is determined by function recursion being applied to the mathematical expression of the model. Linearization is achieved by the linearization function being applied to the input signal (x), where the resulting output signal (z) is used as input to the non-linear electronic device 110.

According to a non-limiting example the non-linear electronic devices 110 is any of an RF amplifier, PA (such as an RF PA in a transmit radio chain), LNA (such as an LNA in a radio receiver structure), DAC, or ADC. According to a non-limiting example, the linearizer device 200 is a pre-distorter, or an equalizer.

In some non-limiting examples, the input signal (x) is received from a signal modulating entity. The signal modulating entity could be a data modulating device e.g. operating at baseband and which is configured to process signals after being channel filtered and/or limited to some amplitude crest factor.

The embodiments disclosed herein relate to mechanisms for enabling linearization of a non-linear electronic device 110. In order to obtain such mechanisms there is provided a linearizer device 200, a method performed by the linearizer device 200, a computer program product comprising code, for example in the form of a computer program, that when run on a linearizer device 200, causes the linearizer device 200 to perform the method.

Figure 2:
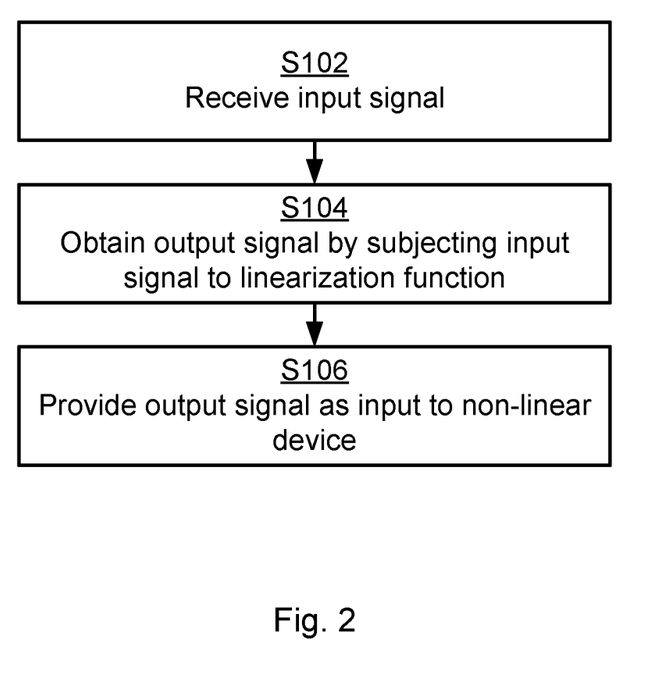
FIG. 2 is a flowchart of methods according to embodiments.
Figure 3:
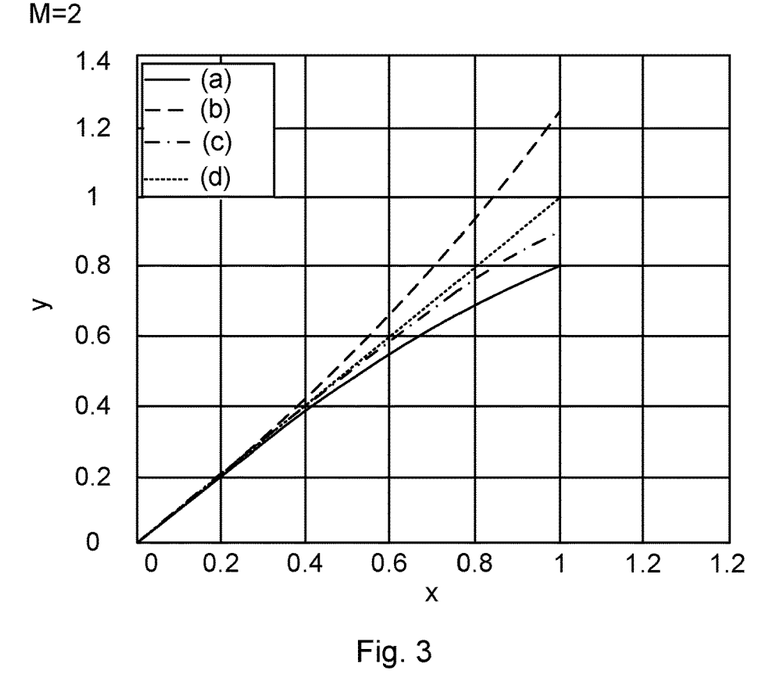
FIGS. 3 to 6 show simulation results according to embodiments.
Figure 4:
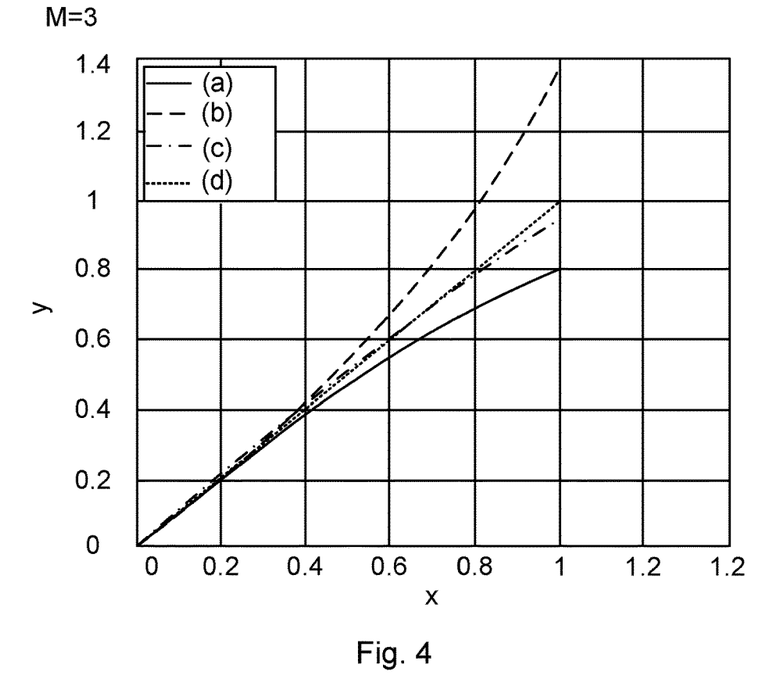
Figure 5:
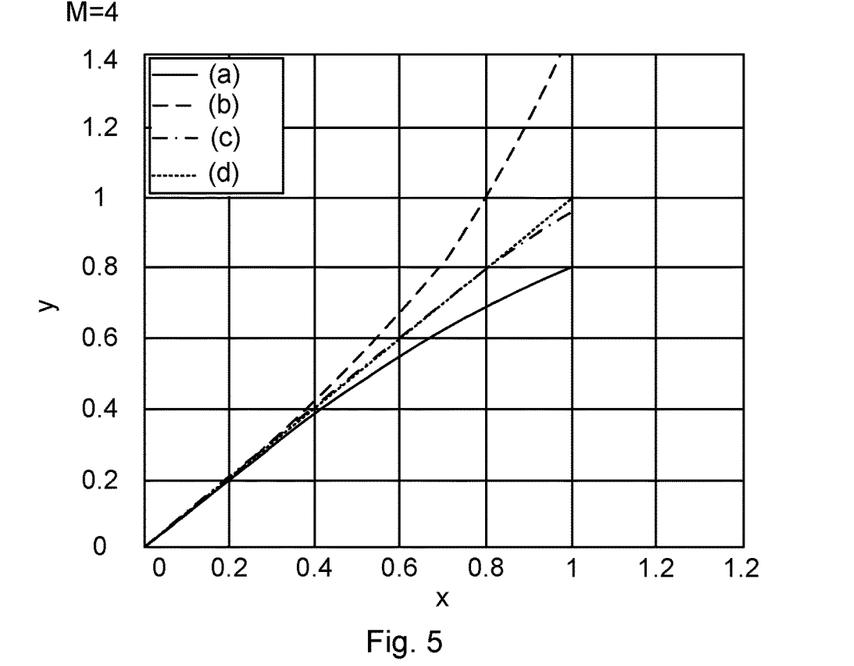
Figure 6:
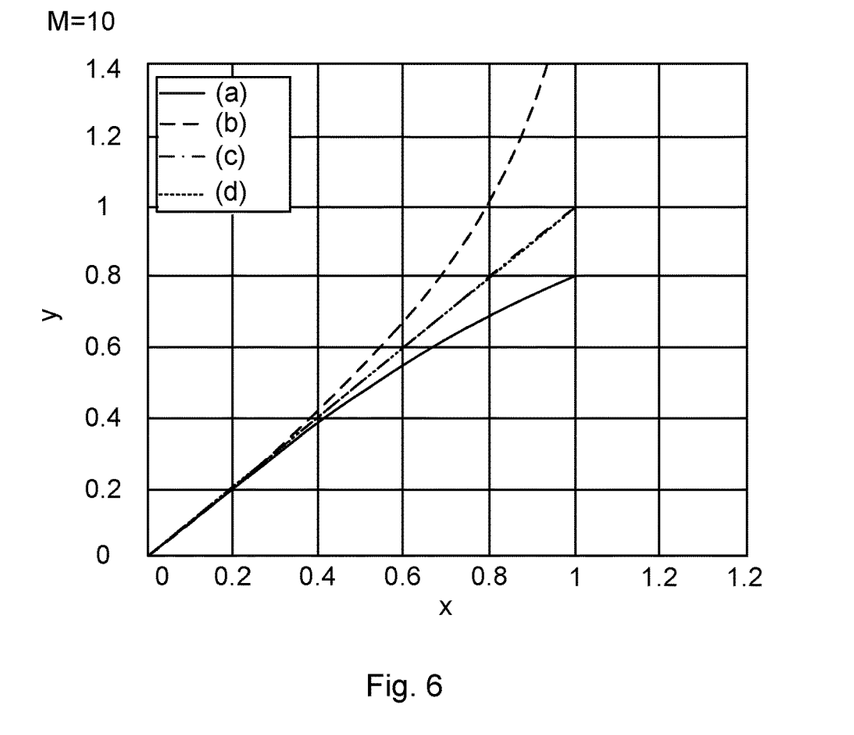

FIG. 2 is a flowchart illustrating embodiments of methods for enabling linearization of a non-linear electronic device

110. The methods are performed by the linearizer device 200. The methods are advantageously provided as computer programs 1020.

S102: The linearizer device 200 receives an input signal (x). The input signal (x) is destined to be input to the non-linear electronic device 110.

Input-output characteristics of the non-linear electronic device 110 is represented by a model. The model is defined by a mathematical expression. Input-output characteristics of the linearizer device 200 is given by the linearization function. The linearization function is determined by applying a function recursion to the mathematical expression of the model.

S104: The linearizer device 200 obtains an output signal (z) by subjecting the input signal (x) to the linearization function.

S106: The linearizer device 200 provides the output signal (z), instead of the input signal (x), as input to the non-linear electronic device 110, thereby enabling linearization of the non-linear electronic device 110.

Embodiments relating to further details of enabling linearization of a non-linear electronic device 110 as performed by the linearizer device 200 will now be disclosed.

There may be different ways to define the linearization function. In some embodiments, the linearization function is defined by the inverse of the model, and where the inverse is determined by function recursion being applied to the mathematical expression of the model.

In some aspects, the linearization function does not depend on more parameters than included in the model. That is, according to some embodiments, the linearization function depends on as many parameters as are included in the model.

There could be different examples of mathematical expressions. In general terms, the mathematical expression depends on the type of model. Different examples of models, and hence of mathematical expressions, will be disclosed next.

According to a first example the model is the memoryless Saleh AM-to-AM model. Hence, according to a first embodiment, the mathematical expression is given by the memoryless Saleh AM-to-AM model.

According to a second example the model is a polynomial model. Hence, according to a second embodiment, the mathematical expression is a memoryless polynomial function, such as a third order memoryless polynomial function.

According to a third example the parameters of the linearization function are adaptively updated to fit the model. Hence, according to a third embodiment, the parameters on which the linearization function depends are iteratively updated based on the input signal (x) and a feedback signal (y) received from the non-linear electronic device 110. In some examples the least means squares (LMS) algorithm, the steepest descent algorithm, or Newton's method, is used to iteratively update the parameters.

According to a fourth example the model is a Finite Impulse Response (FIR) filter. Hence, according to a fourth embodiment, the mathematical expression is representable by a FIR filter. The linearization function might then also represent a FIR filter. That is, in some examples, the FIR filter is a first FIR filter, and wherein the linearization function is representable by a second FIR filter, different from the first FIR filter.

According to a fifth example the model is a non-linear FIR filter. Hence, according to a fifth embodiment, the mathematical expression is representable by a non-linear FIR filter.

According to a sixth example the model is a memory polynomial. Hence, according to a sixth embodiment, the mathematical expression is a polynomial function with memory.

Further details and applications of the above disclosed first to sixth embodiments will now be disclosed. Below, the notation y is used to represent the output from the non-linear electronic device 110 and the notation x is used to represent the input to the non-linear electronic device 110 to illustrate the case where the linearizer device 200 is not present. Conversely, below the notation x is also used to represent the input to the linearizer device 200 and the notation y is also used to represent the output from the linearizer device 200.

Application 1: Inversion of the Saleh Model

The first example concerns inverting the very famous and simple model for an amplifier which is usually called the Saleh model. It has in one form an AM-to-AM formulation and can also be extended to include AM-to-PM distortions. The AM-to-AM formulation describes how the magnitude of the output signal is affected by small changes in the magnitude of the input signal. In a similar manner, the AM-to-PM describes how the phase of the output signal is affected by small changes of the magnitude of the input signal. In this first analysis we only consider the AM-to-AM formulation.

According to the Saleh model, the input-output characteristics of the non-linear electronic device is given by:

$$y = \alpha \cdot \frac{x}{1 + \beta \cdot x^2} \quad (1)$$

Solving for the variable x yields:

$$x = y/\alpha \cdot [1 + \beta \cdot x^2] \quad m = 0 \text{(recursion index)} \quad (2)$$

This expression for the $0^{th}$ order recursion is inserted into itself in Eqn. 2) for the $1^{st}$ order recursion, yielding:

$$x = \frac{y}{\alpha} \cdot \left[1 + \beta \cdot \left[\frac{y}{\alpha} \cdot [1 + \beta \cdot x^2]\right]^2\right] \quad m = 1 \quad 3)$$

Repeating this procedure also for the $2^{nd}$ and $3^{rd}$ order recursions yields the following sequences of solutions the inversion problem:

$$x = \frac{y}{\alpha} \cdot \left[1 + \beta \cdot \left[\frac{y}{\alpha} \cdot \left[1 + \beta \cdot \left[\frac{y}{\alpha} \cdot [1 + \beta \cdot x^2]\right]^2\right]^2\right]^2\right] \quad m = 2 \quad 4)$$

$$x = \frac{y}{\alpha} \cdot \left[1 + \beta \cdot \left[\frac{y}{\alpha}\left[1 + \beta \cdot \left[\frac{y}{\alpha} \cdot \left[1 + \beta \cdot \left[\frac{y}{\alpha} \cdot [1 + \beta \cdot x^2]\right]^2\right]^2\right]^2\right]^2\right]\right] \quad m = 3 \quad 5)$$

This procedure can be continued in order to express the recurrence steps into a general Function Recurrence formulation as:

$$G(m, y) = \begin{cases} \dfrac{y}{\alpha} & \text{if } m = 0 \\ \dfrac{y}{\alpha} \cdot [1 + \beta \cdot G(m-1, y)^2] & \text{otherwise} \end{cases} \quad 6)$$

More formally, if x and y are interchanged, then the linearization function implemented by the linearizer device 200 is formulated as:

$$G(m, x) = \begin{cases} \dfrac{x}{\alpha} & \text{if } m = 0 \\ \dfrac{x}{\alpha} \cdot [1 + \beta \cdot G(m-1, x)^2] & \text{otherwise} \end{cases} \quad 7)$$

This linearization function implements an inverter that inverts the output signal of the Saleh model (AM-to-AM) thus returning the input signal back again. An linearizer device 200 implementing such a linearization function could be used to linearize a pure RF amplifier that could be described by a simple Saleh model for the AM-AM conversion.

It is noted that this expression is not written in any form that forms a linear polynomial expansion in an ordinary power series. It could however be expanded to fit a power series by pure symbolic algebra by at the same time setting any rest term $x^2$ to zero, as exemplified in the expression below for M=3:

$$x = \dfrac{y}{\alpha} + \dfrac{\beta y^3}{\alpha^3} + 2\dfrac{\beta^2 y^5}{\alpha^5} + 5\dfrac{\beta^3 y^7}{\alpha^7} + 6\dfrac{\beta^4 y^9}{\alpha^9} + 6\dfrac{\beta^5 y^{11}}{\alpha^{11}} + 4\dfrac{\beta^6 y^{13}}{\alpha^{13}} + \dfrac{\beta^7 y^{15}}{\alpha^{15}} \quad 8)$$

Simulation results for this application will now be presented with reference to FIG. 3, FIG. 4, FIG. 5, and FIG. 6 for M=2, 3, 4, and 10, respectively. In these figures are shown (a) the input-output characteristics of the non-linear electronic device no, (b) the linearization function (representing the input-output characteristics of the linearizer device 200), (c) the combination of the input-output characteristics of the linearizer device 200 and the input-output characteristics of the non-linear electronic device no, and (d) an ideal linearized reference line. In the results of all these figures, $\alpha$=1, and $\beta$=0.25. For M=10 and for this specific choice of parameter values, the difference between the combination of the input-output characteristics of the linearizer device 200 and the input-output characteristics of the non-linear electronic device no, and the ideal linearized reference line is so small that it is not any-longer visible.

Application 2: Third Order Polynomial

One description of an amplifier forward model aside from the Saleh model is a third order polynomial. Assume that the input-output characteristics of the non-linear electronic device no is represented by a model defined by the mathematical expression:

$$y = a_1 x + a_2 x^3 \quad 9)$$

This is a third order system. For the linearization function, the variable x is to be expressed in terms of $a_1$, $a_2$, and y. Solving for the variable x yields:

$$x = \dfrac{1}{a_1} \cdot (y - a_2 x^3) \quad 10)$$

This is the expression for the $0^{th}$ order recursion. This expression for the $0^{th}$ order recursion is inserted into itself in Eqn. 16) for the $1^{st}$ order recursion, yielding:

$$x = \dfrac{1}{a_1} \cdot \left( y - a_2 \left[ \dfrac{1}{a_1} \cdot (y - a_2 x^3) \right]^3 \right) \quad 11)$$

Repeating this procedure and expanding the expression after 'm' number of re-insertions yields a power series expression for the inverted function. For M=2, the following power series is obtained:

$$x = \dfrac{y}{a_1} - \dfrac{a_2}{a_1^4} y^3 + 3\dfrac{a_2^2}{a_1^7} y^5 - 3\dfrac{a_2^3}{a_1^{10}} y^7 + \dfrac{a_2^4}{a_1^{13}} y^9 + \Delta f(x, y) \quad 12)$$

The residual $\Delta f(x, y)$ will be omitted as the recurrence depth is increased. In view of this power expansion, the coefficients correspond to what is obtained when postulating a power expansion when seeking to solve for the coefficients. A full expansion for the linearization function is obtained by increasing the recursion depth 'm'.

This procedure can again be formally written in terms of Function Recursion. Let the parameter 'm' be the recursion depth, then the Function Recursion can be expressed as:

$$x(m, y) = \dfrac{1}{a_1} \cdot y \quad \text{if } m = 0 \quad 13)$$
$$= \dfrac{1}{a_1} \cdot (y - a_2 \cdot x(m-1, y)^3) \quad \text{otherwise}$$

By interchanging x and y above the linearization function can be expressed as being equal to the inverse expressed above. Thus:

$$G(m, x) = \begin{cases} \dfrac{1}{a_1} \cdot x & \text{if } m = 0 \\ \dfrac{1}{a_1} \cdot (x - a_2 \cdot G(m-1, x)^3) & \text{otherwise} \end{cases} \quad 14)$$

This procedure needs a termination point at M=0 which is indicated above. The recursion depth 'm' corresponds to the polynomial degree for the inversion.

As will be further disclosed below, this technique can be used not only to increase the polynomial power in the linearizer device 200 but also to combine the power series with a second recursion loop that reflects memory effects.

Application 3: Polynomial Amplifier Model

Some representations of amplifiers can be expanded in terms of powers of the input signal the linearization function might also be expressed in terms of a sum of powers. In a first implementation the linearizer function is expressed as a Function Recursion having only two parameters which can be optimized to still fit a wide range of amplifier representations. It is here noted that, even if the model of the non-linear device no is not in the form of a general polynomial but, for example in the Saleh form of any other form (such as tan h(x)), it is still effective to express the recursive form of the linearization function implemented by the linearizer device 200 in terms of few parameters. In general terms, the linearizer function can be expressed as:

$$G(m, x) = \dfrac{1}{a_1} \cdot x \quad \text{if } m = 0 \quad 15)$$
$$= \dfrac{1}{a_1} \cdot \left( x - a_2 \cdot G(m-1, x) \cdot |G(m-1, x)|^2 \right) \quad \text{otherwise}$$

This type of linearizer function might be used for a model as with two parameters only in terms of powers of x. Here, the model of the non-linear electronic device no is expressed as:

$$y = a_1 \cdot x + a_2 \cdot x \cdot |x|^2 \quad 16)$$

In some aspects the two parameters in the recursion expression G(m, x) are optimized, for example by means of iteration, to fit a regular amplifier where the output signal is regularly traced. That is, as disclosed above, the values of the parameters on which the linearization function depends are iteratively updated based on the input signal (x) and a feedback signal (y) received from the non-linear electronic device 110. As an example Newton's method involves extracting the derivative with respect to the two parameters ($a_1$ and $a_2$) of the function G(m, x) and using that matrix during the iterative update of the values of the parameters $a_1$ and $a_2$.

Figure 7:
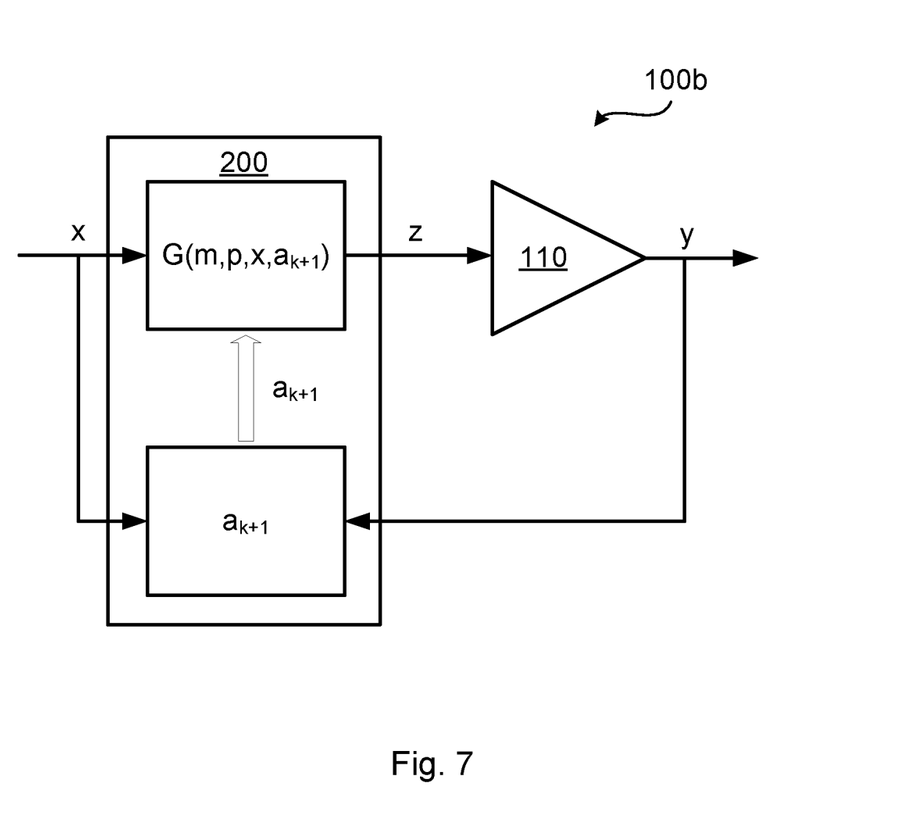

FIG. 7 is a schematic diagram illustrating a system mob similar to that of FIG. 1 and comprises a non-linear electronic device no and a linearizer device 200 according to an embodiment. In FIG. 7 is illustrated that the feedback signal (y) is together with the input signal (x) by the linearizer device 200 used to iteratively update the values of the parameters on which the linearization function depends. The values of the parameters on which the linearization function depends might be iteratively updated according to an adaptation algorithm. One example of such an adaptation algorithm follows what is outlined and expressed in Eqn. 22).

Further aspects of iteratively updating, or adapting, the values of the parameters will now be disclosed. Normal equations to update the parameters $a_1$ and $a_2$ could be expressed as:

$$J \cdot \Delta a = x - y \quad \quad 17)$$

The vector $\Delta a$ may be solved for by means of an LMS method by multiplying the equation with $J^+$ which in turn satisfies $J^+J = I$, where $I$ is the identity matrix.

$$\Delta \alpha = J^+(x - y) \quad \quad 18)$$

Here $J^+$ is a pseudoinverse matrix of the matrix $J$ which satisfies Eqn. 20).

$$J^+ = (J^H J)^{-1} J^H \quad \quad 19)$$

$$J^+ J = (J^H J)^{-1} J^H H = I \quad \quad 20)$$

The equation for iteratively updating the values of the parameters is defined as:

$$\alpha_{k+1} = \alpha_k + \mu \cdot \Delta a \quad \quad 21)$$

For individual parameters the corresponding expression is:

$$\begin{bmatrix} a_1 \\ a_2 \end{bmatrix}_{k+1} = \begin{bmatrix} a_1 \\ a_2 \end{bmatrix}_k + \mu \cdot \begin{bmatrix} \Delta a_1 \\ \Delta a_2 \end{bmatrix} \quad \quad 22)$$

Further, the expression for the derivative matrix M can be written as:

$$J = \left[ -\frac{1}{a_1^2} \cdot x \quad -\frac{1}{a_1^2 |a_1|^2} \cdot x \cdot |x|^2 \right] = [J_1 \quad J_2] \quad \quad 23)$$

The matrix J has dimensions N-by-2 so as to express a solution that requires or proposes a Least Mean Squares (LMS) approach. The column vectors $J_1$ and $J_2$ may be obtained from a general derivative process of Eqn. 15) with respect to $a_1$ and $a_2$. This leads to Eqn. 23) above and the following expressions:

$$J_1 = \frac{\partial}{\partial a_1} G(1, x) = \frac{\partial}{\partial a_1} \left[ \frac{1}{a_1}(x - a_2 G(0, x) \cdot |G(0, x)|^2) \right] = -\frac{1}{a_1^2} x \quad \quad 24)$$

$$J_2 = \frac{\partial}{\partial a_2} G(1, x) = \frac{\partial}{\partial a_2} \left[ \frac{1}{a_1}(x - a_2 G(0, x) \cdot |G(0, x)|^2) \right] = -\frac{1}{a_1^2 |a_1|^2} x|x|^2 \quad \quad 25)$$

That is, the normal equation gives the LMS solution to the original overdetermined set of measurement equations.

Application 4: Equalizer for a FIR Filter

For a non-linear electronic device 110 implementing a FIR filter, the linearizer device 200 might implement an Infinite Impulse Response (IIR) filter. However, IIR filters are potentially unstable, and therefore Function Recursion is applied so as to obtain the FIR filter structure for the linearizer device 200 with the ability to control the number of terms in an equivalent IIR filter structure.

As an illustrative example, consider a non-linear electronic device 110 implementing an FIR filter consisting of only two taps correction:

$$y_n = a_1 x_n + a_2 x_{n-1} \quad \quad 26)$$

Then the first step in deriving a linearizer function would be to solve for $x_n$, according to the expression:

$$x_n = \frac{1}{a_1} \cdot [y_n - a_2 x_{n-1}]) \quad \quad 27)$$

From this expression also readily $x_{n-1}$ can be derived, which would be the only next step needed before formulating the general procedure. Thus:

$$x_{n-1} = \frac{1}{a_1} \cdot [y_{n-1} - a_2 x_{n-2}] \quad \quad 28)$$

This yields in turn after re-insertion the following expression for $x_n$:

$$x_n = \frac{1}{a_1} \cdot \left[ y_n - a_2 \frac{1}{a_1} \cdot [y_{n-1} - a_2 x_{n-2}] \right] \quad \quad 29)$$

In a Function Recursion formulation this would in a forward manner be written as:

$$G(p, y_n) = \frac{1}{a_1} \cdot y_n \quad \quad \text{if } p = 0 \quad \quad 30)$$

$$= \frac{1}{a_1} \cdot [y_n - a_2 G(p - 1, y_{n-1})] \quad \text{otherwise}$$

As an illustrative example, consider a memory depth of M=3:

$$G(3, y_n) = \frac{1}{a_1} \cdot [y_n - a_2 G(2, y_{n-1})] = \quad \quad 31)$$

$$= \frac{1}{a_1} \cdot \left[ y_n - a_2 \frac{1}{a_1} \cdot [y_{n-1} - a_2 G(1, y_{n-2})] \right] =$$

$$= \frac{1}{a_1} \cdot \left[ y_n - a_2 \frac{1}{a_1} \cdot \left[ y_{n-1} - a_2 \frac{1}{a_1} \cdot [y_{n-2} - a_2 G(0, y_{n-3})] \right] \right] =$$

-continued $$= \frac{1}{a_1} \cdot \left[ y_n - a_2 \frac{1}{a_1} \cdot \left[ y_{n-1} - a_2 \frac{1}{a_1} \cdot \left[ y_{n-2} - a_2 \frac{1}{a_1} \cdot y_{n-3} \right] \right] \right] =$$

$$= \frac{1}{a_1} y_n - a \frac{a_2}{a_1^2} y_{n-1} + \frac{a_2^2}{a_1^3} y_{n-2} - \frac{a_2^3}{a_1^4} y_{n-3} =$$

$$= \frac{1}{a_1} \sum_{k}^{3} (-1)^k \left(\frac{a_2}{a_1}\right)^k y_{n-k}$$

This defines a linearizer function with memory depth M=3 for the two-tap FIR filter expressed again as an FIR filter. Although the linearizer function consists of 4 taps, that is 2 more taps than the forward FIR filter, the linearizer function is still just depending on the two tap coefficients $a_1$ and $a_2$. Defining a large FIR filter as an inverter (i.e., as a linearizer function) and calculating (e.g. by means of LMS) the coefficients viewing them as being free and independent parameters would end up un more processing effort than for example evaluating the coefficients by using Eqn. 31).

A general linearizer function can be formulated to involve even more parameters ($a_n$) in the forward expression as:

$$G(p, y_n) = \frac{1}{a_1} \cdot y_n \quad \text{if } p = 0 \qquad 32)$$

$$= \frac{1}{a_1} \cdot \left(y_n - \frac{a_2}{a_1} y_{n-1}\right) \quad \text{if } p = 1$$

$$= \frac{1}{a_1} \cdot [y_n - a_2 G(p-1, y_{n-1}) - a_3 G(p-2, y_{n-2})] \quad \text{otherwise}$$

This would invert the difference equation (i.e. the mathematical expression for the model of the non-linear device 110) defined as:

$$y_n = a_1 x_n + a_2 x_{n-1} + a_3 x_{n-2} \qquad 33)$$

The Function Recursion for Eqn. 33) as defined in Eqn. 32) requires an additional termination condition. That is, it is not sufficient to only have a terminating condition for p=0, but also one for p=1 is necessary.

Application 5: Non-Linear FIR Filter

As a further, example, consider a third order non-linearity and a single-step memory depth filter. That is, consider that the mathematical function of the model of the non-linear device no can be written as follows:

$$y_n = a_1 x_n + a_2 x_n^3 + a_3 x_{n-1} + a_4 x_{n-1}^3 \qquad 34)$$

Formally solving for $x_n$ yields:

$$x_n = \frac{1}{a_1}\left(y_n - a_2 x_n^3 - a_3 x_{n-1} - a_4 x_{n-1}^3\right) \qquad 35)$$

From this expression the delayed sample can be extracted as:

$$x_{n-1} = \frac{1}{a_1}\left(y_{n-1} - a_2 x_{n-1}^3 - a_3 x_{n-2} - a_4 x_{n-2}^3\right) \qquad 36)$$

This procedure can be iterated so as to find a general expression for the k:th delayed sample as:

$$x_{n-k} = \frac{1}{a_1}\left(y_{n-k} - a_2 x_{n-k}^3 - a_3 x_{n-k-1} - a_4 x_{n-k-1}^3\right) \qquad 37)$$

These latter two expressions in Eqn. 35) and Eqn. 36) can be recursively inserted into Eqn. 34). Doing so in a few steps will give a series expansion of $x_n$ that when expanded into powers of delayed versions of $y_n$ have the following form:

$$x_n = \qquad 38)$$

$$= \frac{1}{a_1}$$

$$\left\{ \begin{array}{l} y_n - \frac{a_3}{a_1} y_{n-1} + \left(\frac{a_3}{a_1}\right)^2 y_{n-2} - \frac{a_2}{a_1^3} y_n^3 + \frac{a_2 a_3^3}{a_1^6} y_{n-1}^3 - \frac{a_2 a_3^6}{a_1^9} y_{n-2}^3 + \cdots \\ -\frac{3 a_2 a_3^4}{a_1^7} y_{n-1}^2 y_{n-2} + \frac{3 a_2 a_3^5}{a_1^8} y_{n-1} y_{n-2}^2 + \frac{3 a_2 a_3}{a_1^4} y_{n-1} y_n^2 - \frac{3 a_2 a_3^2}{a_1^5} y_{n-1}^2 y_n - \\ -\frac{3 a_2 a_3^2}{a_1^5} y_{n-2} y_n^2 - \frac{3 a_2 a_3^4}{a_1^7} y_{n-2}^2 y_n + \frac{6 a_2 a_3^3}{a_1^6} y_n y_{n-1} y_{n-2} \end{array} \right.$$

Expressed by use of collapsed parameters $\beta_k$, the inverse of this non-linear FIR is given in Eqn. 39). The values of each $\beta_k$ may be found by term-by-term analysis and comparison with Eqn. 31).

$$x_n = \frac{1}{a_1}\left( \begin{array}{l} y_n + \beta_1 y_{n-1} + \beta_2 y_{n-2} + \beta_3 y_n^3 + \beta_4 y_{n-1}^3 + \beta_5 y_{n-2}^3 + \cdots \\ \beta_6 y_{n-1}^2 y_{n-2} + \beta_7 y_{n-1} y_{n-2}^2 + \beta_8 y_{n-1} y_n^2 + \beta_9 y_{n-1}^2 y_n + \cdots \\ + \beta_{10} y_{n-2} y_n^2 + \beta_{11} y_{n-2}^2 y_n + \beta_{12} y_n y_{n-1} y_{n-2} \end{array} \right) \qquad 39)$$

According to Eqn. 38), there is a general pattern in the coefficients for the linear terms in that they follow the expansion outlined in Eqn. 31). Furthermore, the series expansion for the non-linear part also seem fits with the expansion given in Eqn. 12).

The coefficients for all the terms are interlocked by only the original four coefficients $a_1$, $a_2$, $a_3$, and $a_4$ in the expansion of the non-linear model that is to be inverted.

Application 6: Memory Polynomial

One extension to the basic polynomial approach for both modelling and amplifier and to use it as a linearizer function is the Memory Polynomial approach expressed at complex baseband, which can be expressed as follows:

$$y_n = a_1 x_n + a_2 x_n |x_n|^2 + a_3 x_{n-1} + a_4 x_{n-1} |x_{n-1}|^2 \qquad 40)$$

The AM-to-AM dependence is handled as in Eqn. 16). The AM-to-PM dependence is handled by the coefficients (i.e., $a_1$, $a_2$, $a_3$, and $a_4$) allowed to be complex-valued. The memory effects are handled by two extra terms being added. These terms depend on one delayed sample. As the skilled person understands, in a more general description, more power terms could be added, as well as more terms depending on further delayed samples. Written instead in conjugate form the same expression as in Eqn. 40) yields:

$$y_n = a_1 x_n + a_2 x_n^2 x_n^* + a_3 x_{n-1} + a_4 x_{n-1}^2 x_{n-1}^* \qquad 41)$$

According to the herein disclosed embodiments, a Function Recursion (instead of stipulating a Memory Polynomial) can be applied where the coefficients are solved for by, for example, minimizing some cost-function directly for the unknown coefficients. The Function Recursion would then follow the following steps:

$$G(m,p,n) =\begin{cases} \dfrac{1}{a_1}[x_n - a_3 \cdot G(0, p-1, n-1)], & \text{if } m = 0 \\ \dfrac{1}{a_1}\left[x_n - a_2 \cdot G(m-1, 0, n)^2 \cdot G(m-1, 0, n)^*\right], & \text{if } m > 0 \text{ and } p = 0 \\ \dfrac{1}{a_1} x_n, & \text{if } m = 0 \text{ and } p = 0 \\ \dfrac{1}{a_1}\begin{bmatrix} x_n - a_2 \cdot G(m-1, p, n)^2 \cdot G(m-1, p, n)^* - a_3 \cdot G(m-1, p-1, n-1) \\ -a_4 \cdot G(m-1, p-1, n-1)^2 \cdot G(m-1, p-1, n-1)^* \end{bmatrix}, & \text{otherwise} \end{cases} \quad 42)$$

In this expression, the parameter n is a sample index, and the parameters m and p are recursion parameters. This expression can be used as the linearizer function as implemented by the linearizer device 20 for enabling linearization of a non-linear electronic device no which has a non-linear transfer function such as described in Eqn. 41).

The number of parameters in Eqn. 41) might be increased as to reflect higher order of non-linearity and also larger memory depth, but the general outline for the linearizer function as in Eqn. 42) will still hold.

If the values of the parameters $a_1$, $a_2$, $a_3$, and $a_4$ are actually known from some characterization process of the non-linear electronic device 110, then there is no need to determine these values. However, it might be so that although these values are known, the true values might slightly vary with aging, temperature or by some other external dependence. These changes might be traced in order to update the values.

Figure 8:
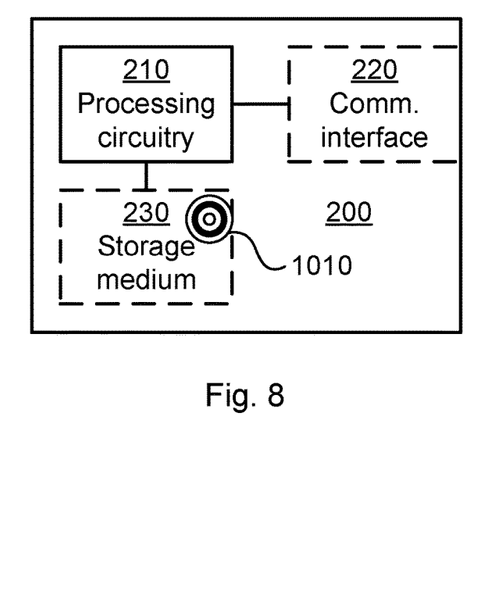
FIG. 8 is a schematic diagram showing functional units of a linearizer device according to an embodiment.

FIG. 8 schematically illustrates, in terms of a number of functional units, the components of a linearizer device 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 1010 (as in FIG. 10), e.g. in the form of a storage medium 230. The processing circuitry 210 may further be provided as at least one application specific integrated circuit (ASIC), or field programmable gate array (FPGA).

Particularly, the processing circuitry 210 is configured to cause the linearizer device 200 to perform a set of operations, or steps, as disclosed above. For example, the storage medium 230 may store the set of operations, and the processing circuitry 210 may be configured to retrieve the set of operations from the storage medium 230 to cause the linearizer device 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The linearizer device 200 may further comprise a communications interface 220 at least configured for receiving signals as input and providing processed signals as output. As such the communications interface 220 may comprise one or more transmitters and receivers, comprising analogue and digital components. The processing circuitry 210 controls the general operation of the linearizer device 200 e.g. by sending data and control signals to the communications interface 220 and the storage medium 230, by receiving data and reports from the communications interface 220, and by retrieving data and instructions from the storage medium 230. Other components, as well as the related functionality, of the linearizer device 200 are omitted in order not to obscure the concepts presented herein.

Figure 9:
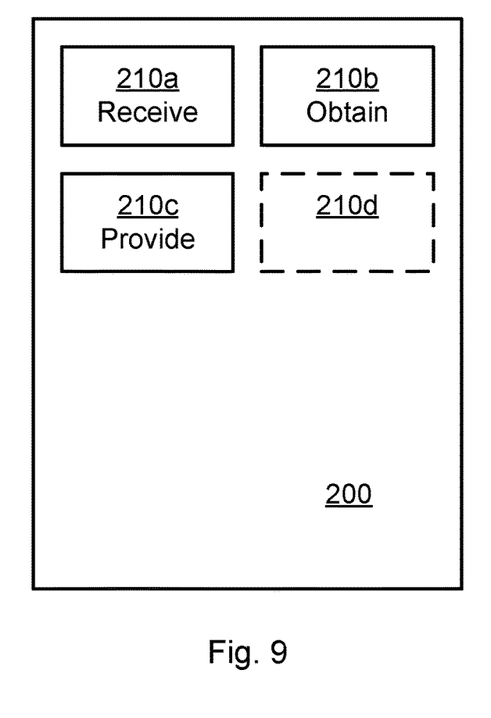
FIG. 9 is a schematic diagram showing functional modules of a linearizer device according to an embodiment.

FIG. 9 schematically illustrates, in terms of a number of functional modules, the components of a linearizer device 200 according to an embodiment. The linearizer device 200 of FIG. 9 comprises a number of functional modules; a receive module 210a configured to perform step S102, an obtain module 210b configured to perform step S104, and a provide module 210C configured to perform step S106. The linearizer device 200 of FIG. 9 may further comprise a number of optional functional modules, as represented by functional module 210d. In general terms, each functional module 210a-210d may in one embodiment be implemented only in hardware and in another embodiment with the help of software, i.e., the latter embodiment having computer program instructions stored on the storage medium 230 which when run on the processing circuitry makes the linearizer device 200 perform the corresponding steps mentioned above in conjunction with FIG. 11. It should also be mentioned that even though the modules correspond to parts of a computer program, they do not need to be separate modules therein, but the way in which they are implemented in software is dependent on the programming language used. Preferably, one or more or all functional modules 210a-210d may be implemented by the processing circuitry 210, possibly in cooperation with the communications interface 220 and/or the storage medium 230. The processing circuitry 210 may thus be configured to from the storage medium 230 fetch instructions as provided by a functional module 210a-210d and to execute these instructions, thereby performing any steps as disclosed herein.

The linearizer device 200 may be provided as a standalone device or as a part of at least one further device. For example, the functionality of the linearizer device 200 may collocated with the functionality of the non-linear electronic device no. A first portion of the instructions performed by the linearizer device 200 may be executed in a first device, and a second portion of the of the instructions performed by the linearizer device 200 may be executed in a second device; the herein disclosed embodiments are not limited to any particular number of devices on which the instructions performed by the linearizer device 200 may be executed. Examples of linearizer devices 200 have been provided above.

Figure 10:
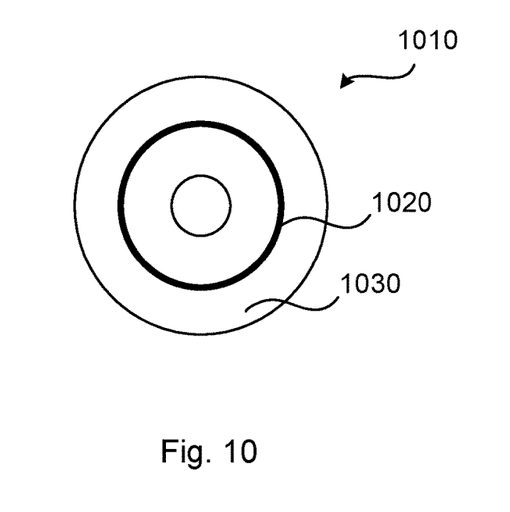
FIG. 10 shows one example of a computer program product comprising computer readable storage medium according to an embodiment.

FIG. 10 shows one example of a computer program product 1010 comprising computer readable storage medium 1030. On this computer readable storage medium 1030, a computer program 1020 can be stored, which computer program 1020 can cause the processing circuitry 210 and thereto operatively coupled entities and devices, such as the communications interface 220 and the storage medium 230, to execute methods according to embodiments described herein. The computer program 1020 and/or computer program product 1010 may thus provide means for performing any steps as herein disclosed.

In the example of FIG. 10, the computer program product 1010 is illustrated as an optical disc, such as a CD (compact disc) or a DVD (digital versatile disc) or a Blu-Ray disc. The computer program product 1010 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1020 is here schematically shown as a track on the depicted optical disk, the computer program 1020 can be stored in any way which is suitable for the computer program product 1010.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for enabling linearization of a non-linear electronic device, the method being performed by a linearizer device, the method comprising:
receiving an input signal destened to be input to the non-linear electronic device,
wherein input-output characteristics of the non-linear electronic device is represented by a model, wherein the model is defined by a mathematical expression, and wherein input-output characteristics of the linearizer device is given by the linearization function, the linearization function being determined by applying a function recursion to the mathematical expression of the model,
obtaining an output signal by subjecting the input signal to the linearization function; and
providing the output signal, instead of the input signal (x), as input to the non-linear electronic device, thereby enabling linearization of the non-linear electronic device and wherein the linearization function is defined by the inverse of the model, and wherein the inverse is determined by function recursion being applied to the mathematical expression of the model.

2. The method according to claim 1, wherein the linearization function depends on as many parameters as are included in the model.

3. The method according to claim 1, wherein the mathematical expression is given by the memoryless Saleh AM-to-AM model.

4. The method according to claim 1, wherein the mathematical expression is a memoryless polynomial function.

5. The method according to claim 2, wherein the parameters on which the linearization function depends are iteratively updated based on the input signal and a feedback signal received from the non-linear electronic device.

6. The method according to claim 5, wherein a least means squares, LMS, algorithm, a steepest descent algorithm, or Newton's method, is used to iteratively update the parameters.

7. The method according to claim 1, wherein the mathematical expression is representable by a FIR filter.

8. The method according to claim 7, wherein the FIR filter is a first FIR filter, and wherein the linearization function is representable by a second FIR filter, different from the first FIR filter.

9. The method according to claim 1, wherein the mathematical expression is representable by a non-linear FIR filter.

10. The method according to claim 1, wherein the mathematical expression is a polynomial function with memory.

11. The method according to claim 1, wherein the input signal is received from a signal modulating entity.

12. The method according to claim 1, wherein the non-linear electronic device is an RF amplifier, PA, LNA, DAC, or ADC.

13. The method according to claim 1, wherein the linearizer device is a pre-distorter, or an equalizer.

14. A linearizer device for enabling linearization of a non-linear electronic device, the linearizer device comprising processing circuitry, the processing circuitry being configured to cause the linearizer device to:
receive an input signal destened to be input to the non-linear electronic device,
wherein input-output characteristics of the non-linear electronic device is represented by a model, wherein the model is defined by a mathematical expression, and wherein input-output characteristics of the linearizer device is given by the linearization function, the linearization function being determined by applying a function recursion to the mathematical expression of the model,
obtain an output signal by subjecting the input signal to the linearization function; and
provide the output signal, instead of the input signal, as input to the non-linear electronic device, thereby enabling linearization of the non-linear electronic device and wherein the linearization function is defined by the inverse of the model, and wherein the inverse is determined by function recursion being applied to the mathematical expression of the model.

15. A computer program product comprising a non-transitory computer-readable storage medium, having stored thereon a computer program for enabling linearization of a non-linear electronic device, the computer program comprising instructions, which when executed by a computer cause the computer to carry out the steps of the method of claim 1.

* * * * *